United States Patent [19]

Carter

[11] 4,346,310
[45] Aug. 24, 1982

[54] VOLTAGE BOOSTER CIRCUIT

[75] Inventor: Ernest A. Carter, Austin, Tex.

[73] Assignee: Motorola, Inc., Schaumburg, Ill.

[21] Appl. No.: 148,096

[22] Filed: May 9, 1980

[51] Int. Cl.³ .......................... H03K 6/02; H03K 5/02
[52] U.S. Cl. .................................. 307/264; 307/475; 307/578
[58] Field of Search ............... 307/264, 475, 482, 574, 307/578, 246

[56] References Cited

U.S. PATENT DOCUMENTS

| | | | |
|---|---|---|---|
| 4,010,388 | 3/1977 | Alvarez, Jr. ........................ | 307/578 |
| 4,029,973 | 6/1977 | Kobayashi et al. ................. | 307/264 |
| 4,049,979 | 9/1977 | Shieu et al. ........................ | 307/482 |
| 4,061,929 | 12/1977 | Asano ................................. | 307/264 |
| 4,176,289 | 11/1979 | Leach et al. ....................... | 307/578 |

Primary Examiner—John Zazworsky
Attorney, Agent, or Firm—Anthony J. Sarli, Jr.; Vincent B. Ingrassia; Jeffrey Van Myers

[57] ABSTRACT

An MOS voltage boost circuit includes a first field-effect-transistor coupled between ground and an output node and a second, depletion type, field effect transistor coupled between the output node and a source of supply voltage ($V_{DD}$). The first transistor is turned off by a disabling signal, and the second transistor is turned on by an enabling signal derived, in part, from the disabling signal. This produces a first voltage at the output node. A third field-effect-transistor is capacitively coupled between the output node and the enabling signal to boost the output voltage when the enabling signal terminates.

7 Claims, 8 Drawing Figures

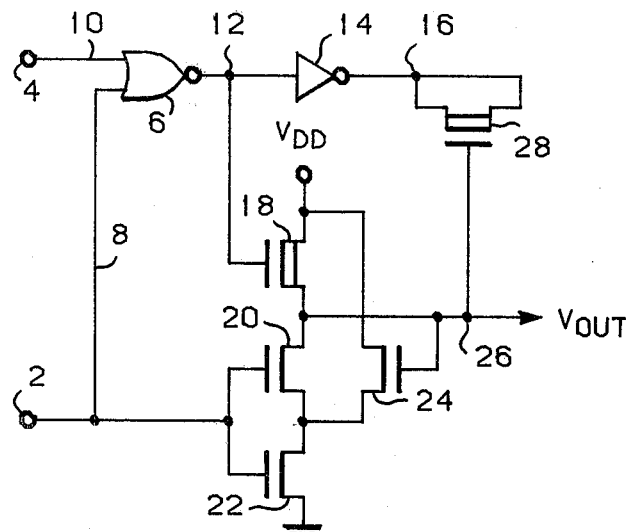
FIG 1
FIG 1A
FIG 2A
FIG 2B
FIG 2C
FIG 2D
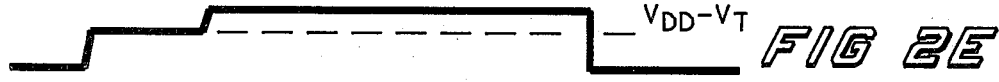
FIG 2E
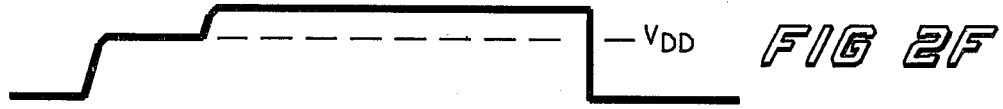
FIG 2F

VOLTAGE BOOSTER CIRCUIT

BACKGROUND OF THE INVENTION

1. Field of the Invention

This invention relates generally to voltage boost circuits, and more particularly to a metal-oxide-semiconductor (MOS) voltage boost circuit which is simple, occupies little silicon area and which substantially eliminates leakage current problems.

2. Description of the Prior Art

The advantages offered by NMOS technology are well known; e.g. higher density, greater yield, etc. Thus, smaller NMOS device geometries permit a greater number of devices to be produced per unit area or, stated another way, a single NMOS device will occupy less space. This characteristic is extremely important in the design and fabrication of complex digital integrated circuits; for example, single chip microprocessors.

Whereas digital circuitry is generally characterized by its "on/off" or "one/zero" nature, most measurements in the real world are inherently analog; e.g. temperature, pressure, speed, voltage, etc. Therefore, it is necessary that microprocessors and other digital circuitry communicate or interface with analog circuitry such as amplifiers, buffers, comparators, etc., in order to permit digital processing of analog signals. The required interfacing may be accomplished by providing analog components which are external to the microprocessor chip. However, such arrangements are generally more expensive, require more current, a larger power supply and commonly present more opportunities for design and manufacturing errors. To avoid these disadvantages, complex analog circuits such as voltage boosters are being manufactured integrally with the digital circuitry; e.g., on the microprocessor chip itself, and due to the complex nature of microprocessors, the inclusion of analog devices on the same chip requires that the same manufacturing process be employed. To avoid undesirable attenuation of analog signals due to threshold drops, voltage boost circuits are often necessary. A voltage boost circuit included on an NMOS microprocessor chip must be fabricated in accordance with NMOS processing techniques, and the design of the voltage boost circuit must be tailored to such processing techniques.

SUMMARY OF THE INVENTION

It is an object of the present invention to provide an improved voltage boost circuit.

It is a further object of the invention to provide an improved voltage boost circuit comprised of N-Channel field effect transistors.

It is a still further object of the invention to provide an improved NMOS voltage boost circuit which generates a boosted output which is nearly double the supply voltage ($V_{DD}$), attenuated only by load and parasitic capacitances.

Finally, it is an object of the present invention to provide an improved voltage boost circuit comprised of N-Channel field effect transistors which is simple, occupies less silicon area, and substantially eliminates problems due to leakage current.

According to one aspect of the invention there is provided a circuit for generating, at an output node, a voltage which is higher than the circuit's supply voltage, comprising: a first field-effect-transistor having a source electrode coupled to ground, a drain electrode coupled to said output node and a gate electrode coupled to the disabling signal for turning said first field-effect-transistor off; a second field-effect-transistor having a source electrode coupled to said output node, a drain electrode coupled to said supply voltage and a gate electrode coupled to an enabling signal for turning said second field-effect-transistor on when said first field-effect-transistor turns off to produce a first voltage at said output node; and voltage boost means coupled to said output node and responsive to the termination of said enabling signal for increasing the voltage at said output node.

According to a further aspect of the invention there is provided an MOS voltage boost circuit for generating, at an output node, a voltage which is substantially higher than the circuit's supply voltage, comprising: a first field-effect-transistor having a source electrode coupled to ground, a drain electrode coupled to said output node and a gate electrode coupled to a disabling signal for turning said first field-effect-transistor off; a second field-effect-transistor having a source electrode coupled to said output node, a drain electrode coupled to said supply voltage and a gate electrode coupled to an enabling signal for turning said second field-effect-transistor on when said first field-effect-transistor turns off to produce a voltage at said output node; and a third field-effect-transistor capacitively coupled between said output node and said enabling signal for increasing the voltage at said output node when said enabling signal terminates.

The above and other objects, features and advantages of the present invention will be more clearly understood from the following detailed description taken in conjunction with the accompanying drawings, in which:

BRIEF DESCRIPTION OF THE DRAWINGS

FIG. 1 is a schematic diagram of the inventive voltage boost circuit;

FIG. 1A is a schematic diagram of a modified form of one portion of the voltage boost circuit of FIG. 1; and FIGS. 2A–2F illustrate waveforms which appear at various points in the circuit of FIG. 1 and which aid in an explanation thereof.

DESCRIPTION OF THE PREFERRED EMBODIMENT

Referring to FIG. 1, terminals 2 and 4 are coupled to first and second inputs of NOR gate 6 via conductors 8 and 10 respectively. Terminal 2 is also coupled to the gate electrodes of enhancement type field-effect-transistors 20 and 22 which have their current conducting paths coupled in series with each other between ground and the source electrode of depletion type field-effect-transistor 18 (node 26). The output of NOR gate 6 (node 12) is coupled to the input of inverter 14 and to the gate electrode of depletion device 18 which has a drain electrode coupled to a source of supply voltage ($V_{DD}$). The output of the circuit (node 26) is coupled to the gate electrode of depletion type field-effect-transistor 28 and to the gate electrode of enhancement type field effect transistor 24. Field-effect-transistor 24 has a drain electrode coupled to $V_{DD}$ and a source electrode coupled to the current conducting junction of field-effect-transistors 20 and 22 (node 30). Finally, depletion type field-effect-transistor 28 has its source and drain electrodes coupled to the output of inverter 14 (node 16).

The maximum output voltage obtainable depends on the total capacitance coupled to output node 26. That is, $V_{OUT}$(MAX) is approximately equal to $$V_{DD}(1+C_{28}/(C_{28}+C_{LOAD}))$$

where $C_{28}$ is the gate capacitance of depletion device 28 and $C_{LOAD}$ represents all other capacitance coupled to output node 26.

The signal applied to terminal 2 may be considered a disable signal which disables transistors 20 and 22 when it is low (See FIG. 2A). The signal appearing at terminal 4 is low when the master enable signal goes low and goes high after a predetermined delay Δt shown in FIG. 2B. The cross hatched portions of FIG. 2B represent don't care conditions. These don't care portions actually permit the waveform occurring at node 4 to be applied to more than one booster circuit.

With the signals at terminals 2 and 4 both low, the output of NOR gate 6 (node 12) goes high for a duration Δt (FIG. 2C). The low at terminal 2 causes enhancement devices 20 and 22 to be turned off, and the high enabling voltage at the output of NOR gate 6 causes depletion device 18 to be turned on. With a high voltage at node 12, a low voltage is produced at the output of inverter 14 (node 16; FIG. 2D). With depletion device 18 on and enhancement devices 20 and 22 off, the voltage at node 26 (the output voltage) rises to $V_{DD}$ (FIG. 2F). Since this output voltage is applied to the gate electrode of device 24, device 24 is turned on causing the voltage at node 30 to increase to one threshold voltage ($V_T$) below $V_{DD}$ as is shown in FIG. 2E.

When the voltage at terminal 4 again goes high (at the end of duration Δt in FIG. 2B), the output of NOR gate 6 (node 12) will go low causing depletion device 18 to turn off. Thus, output node 26 becomes floating. The output of inverter 14 (node 16) rises to $V_{DD}$ and depletion device 28 which is used as a capacitor between nodes 16 and 26 causes the voltage at node 26 to be boosted to a voltage higher than $V_{DD}$ (typically 8–9 volts) as shown in FIG. 2F.

Field effect transistors 18 and 20, which could cause leakage at node 26, are very strongly reversed biased which substantially reduces leakage problems. If the output voltage ($V_{OUT}$) at node 26 is assumed to be 8 volts and $V_{DD}$ 5 volts, then the gate-to-source and gate-to-drain voltages for device 18 are −8 volts and −5 volts respectively. The gate-to-source and gate-to-drain voltages for device 20 are −5 volts and −8 volts respectively. Since the threshold voltage of device 18 is typically −3.5 volts, and the threshold voltage for device 20 is approximately 0.4 volts to 0.9 volts, both devices are off.

Devices 22 and 24 provide a reverse bias for device 20 in the case of very low enhancement thresholds. Otherwise, devices 22 and 24 could be omitted and node 30 connected directly to ground as shown in FIG. 1A. Further, the gate electrode of device 24 could be connected to $V_{DD}$ directly rather than to node 26; however, this would result in increased power consumption. Alternatively, the gate electrode of device 24 could be connected to node 16 and still obtain proper circuit operation, but this connection would very likely require more silicon area. All devices have sizes which are consistent with typical logic circuits except depletion device 28 which is used as a capacitor and hence is simply a large area device.

In summary, there has been disclosed a voltage boost circuit which is simple, requires little silicon area, and is characterized by longer boost hold time due to minimized leakage. Through the use of only a single capacitor (the gate capacitor of device 28), the circuit generates a boosted output voltage of approximately double the supply voltage which is attenuated only by load and parasitic capacitance but which is not reduced by any threshold drops.

The above description is given by way of example only. Changes in form and details may be made by one skilled in the art without departing from the scope of the invention as defined by the appended claims.

I claim:

1. A circuit for generating, at an output node, a voltage which is higher than the circuit's supply voltage, comprising:
   a first field-effect-transistor having a source electrode coupled to ground, a drain electrode coupled to said output node and a gate electrode coupled to a disabling signal for turning said first field-effect-transistor off;
   a second field-effect-transistor of a depletion type having a source electrode coupled to said output node, a drain electrode coupled to said supply voltage and a gate electrode coupled to an enabling signal for turning said second field-effect-transistor on when said first field-effect-transistor turns off to produce a first voltage at said output node; and
   voltage boost means coupled to said output node and responsive to the termination of said enabling signal for increasing the voltage at said output node, said voltage boost means comprising:
      inverter means having an input coupled to said enabling signal and having an output; and
      a third field-effect-transistor having source and drain electrodes coupled to the output of said inverter means and having a gate electrode coupled to said output node.

2. A circuit according to claim 1 wherein said first field-effect-transistor is of an enhancement type and said third field-effect-transistor is of a depletion type.

3. A circuit for generating, at an output node, a voltage which is higher than the circuit's supply voltage, comprising:
   a first field-effect-transistor having a source electrode coupled to ground, a drain electrode coupled to said output node and a gate electrode coupled to a disabling signal for turning said first field-effect-transistor off;
   a second field-effect-transistor of a depletion type having a source electrode coupled to said output node, a drain electrode coupled to said supply voltage and a gate electrode coupled to an enabling signal for turning said second field-effect-transistor on when said first field-effect-transistor turns off to produce a first voltage at said output node;
   voltage boost means coupled to said output node and responsive to the termination of said enabling signal for increasing the voltage at said output node, said voltage boost means comprising:
      inverter means having an input coupled to said enabling signal and having an output; and
      a third field-effect-transistor having source and drain electrodes coupled to the output of said inverter means and having a gate electrode coupled to said output node; and
   a fourth field-effect-transistor having its current conducting path coupled between the source of said first field-effect-transistor and ground and having a gate electrode coupled to said disabling signal; and a fifth field-effect-transistor having a source electrode coupled to the source of said first field-effect-transistor, a drain electrode coupled to said supply voltage and a gate electrode coupled to said output node, said fourth and fifth field-effect-transistors for reverse biasing said first field-effect-transistor.

4. A circuit according to claim 3 further including logic means for producing said enabling signal at an output thereof, said logic means having a first input coupled to said disabling signal and a second input coupled to a signal which is low when said disabling signal is low and which goes high after a predetermined delay.

5. A circuit according to claim 4 wherein said logic means is a NOR gate and wherein said enabling and disabling signals are capable of assuming low and high stable states, said disabling signal being active when low and said enabling signal being active when high.

6. An MOS voltage boost circuit for generating, at an output node, a voltage which is substantially higher than the circuit's supply voltage, comprising:

a first field-effect-transistor having a source electrode coupled to ground, a drain electrode coupled to said output node and a gate electrode coupled to a disabling signal for turning said first field-effect-transistor off;

a second field-effect-transistor of a depletion type having a source electrode coupled to said output node, a drain electrode coupled to said supply voltage and a gate electrode coupled to an enabling signal for turning said second field-effect-transistor on when said first field-effect-transistor turns off to produce a voltage at said output node;

inverter means having an input coupled to said enabling signal and having an output; and a third field-effect-transistor having source and drain electrodes coupled to the output of said inverter means and having a gate electrode coupled to said output node for increasing the voltage at said output node when said enabling signal terminates.

7. A circuit according to claim 6 further comprising:

a fourth field-effect-transistor having its current conducting path coupled between the source of said first field-effect-transistor and ground and having a gate electrode coupled to said disabling signal; and a fifth field-effect-transistor having a source electrode coupled to the source of said field-effect-transistor, a drain electrode coupled to said supply voltage and a gate electrode coupled to said output node, said fourth and fifth field-effect-transistors for reverse biasing said first field-effect-transistor.

* * * * *